(12) United States Patent
Momeni

(10) Patent No.: US 6,394,158 B1
(45) Date of Patent: May 28, 2002

(54) METHOD AND DEVICE FOR THERMALLY BONDING CONNECTING SURFACES OF TWO SUBSTRATES

(75) Inventor: Kaveh Momeni, Berlin (DE)

(73) Assignee: Pac Tech Packaging Technologies GmbH (DE)

( * ) Notice: Subject to any disclaimer, the term of this patent is extended or adjusted under 35 U.S.C. 154(b) by 0 days.

(21) Appl. No.: 09/554,898

(22) PCT Filed: Nov. 20, 1998

(86) PCT No.: PCT/DE98/03439

§ 371 (c)(1),
(2), (4) Date: Jul. 14, 2000

(87) PCT Pub. No.: WO99/26753

PCT Pub. Date: Jun. 3, 1999

(30) Foreign Application Priority Data

Nov. 20, 1997 (DE) .......................... 197 51 487

(51) Int. Cl.[7] .............................................. B23K 26/00
(52) U.S. Cl. ..................... 152/272.8; 156/64; 156/378; 156/379.6; 156/379.8; 156/380.9; 219/85.13; 219/121.64; 219/121.79; 219/121.8; 219/121.83
(58) Field of Search ................................ 156/64, 272.8, 156/378, 379.8, 380.9, 379.6; 219/85.12, 85.13, 121.61, 121.62, 121.63, 121.64, 121.78, 121.79, 121.8, 121.81, 121.83, 121.85

(56) References Cited

U.S. PATENT DOCUMENTS 4,845,335 A * 7/1989 Andrews et al. ....... 219/121.63
4,863,538 A * 9/1989 Deckard .................. 156/272.8
4,978,835 A   12/1990 Luijtjes et al.
5,055,652 A * 10/1991 Jones et al. ............ 219/121.63
5,847,356 A * 12/1998 Santhanam ............ 219/121.63

FOREIGN PATENT DOCUMENTS

| DE | 140 942 | 4/1980 |
|----|---------|--------|
| DE | 41 11 247 A1 | 10/1992 |
| DE | 44 46 289 A1 | 6/1996 |
| DE | 195 04 967 A1 | 8/1996 |
| EP | 0 113 895 A1 | 7/1984 |
| EP | 0 326 020 A2 | 8/1989 |
| EP | 0 758 145 A2 | 2/1997 |
| FR | 2 236 666 | 8/1973 |
| GB | 2 244 374 A | 11/1991 |
| JP | 4-91493 | 3/1992 |
| WO | WO 91/06389 | 5/1991 |
| WO | WO 91/14529 | 10/1991 |

OTHER PUBLICATIONS

Rofin–Sinar Jan./Feb. 1992 Elektonik Produktion & Prufttechnik textbook in EPP no translation.

* cited by examiner

Primary Examiner—Jeff H. Aftergut
Assistant Examiner—Justin Fischer
(74) Attorney, Agent, or Firm—McGlew and Tuttle, P.C.

(57) ABSTRACT

A method for the thermal connection of overlapping connecting surfaces (19, 20) of two substrates (17, 18), at least one substrate (18) being 5 transparent and laser energy being applied to the connecting surfaces (19, 20) from a rear side (26) of the transparent substrate (18), laser energy being applied separately to each of the contact pairs (37) constructed between two connecting surfaces (19, 20) of the opposing substrates (17, 18).

10 Claims, 3 Drawing Sheets

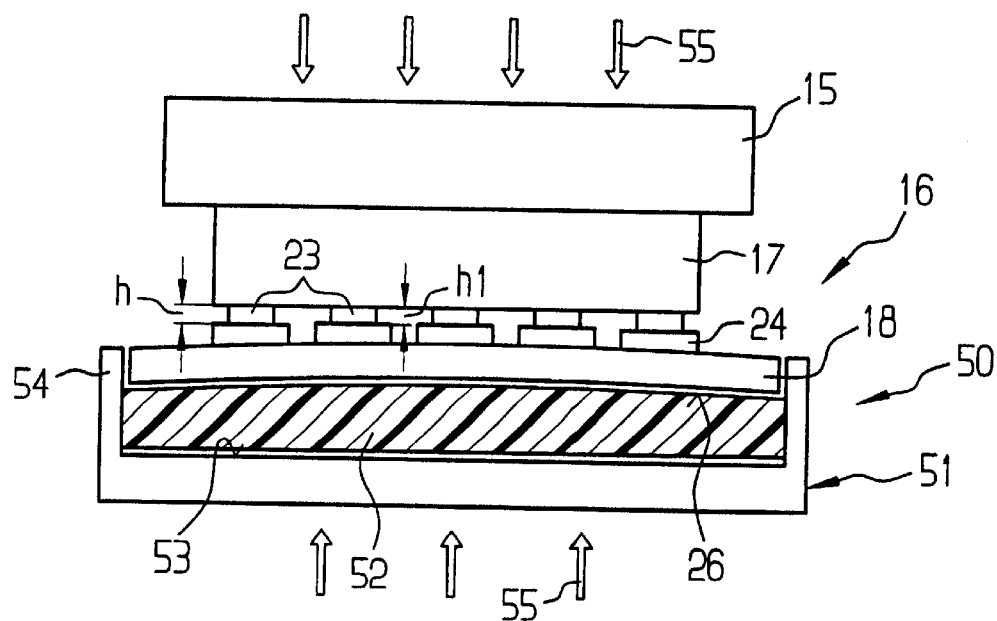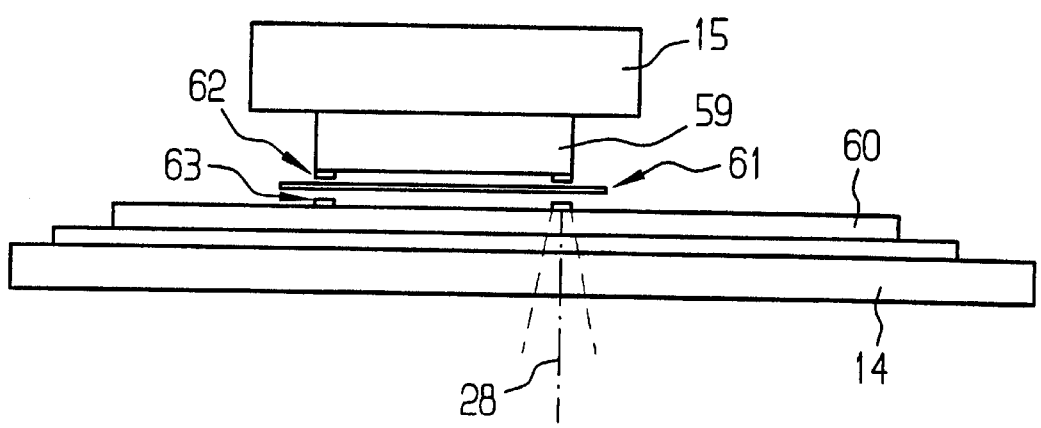

METHOD AND DEVICE FOR THERMALLY BONDING CONNECTING SURFACES OF TWO SUBSTRATES

FIELD OF THE INVENTION

The present invention relates to a method for the thermal connection of overlapping connecting surfaces of two substrates, at least one substrate being transparent and laser energy being applied to the connecting surfaces from a rear side of the transparent substrate. The present invention further relates to a device for manufacturing a thermal connection of overlapping connecting surfaces of two substrates, at least one substrate being transparent and laser energy being applied to the connecting surfaces from a rear side of the transparent substrate, comprising a laser emitting device for emitting radiation energy and a radiation transmitting device for transmitting the radiation energy from the laser emitting device to a contact pair of connecting surfaces.

The term substrate in the present case is understood to include all components which are provided with a conductor structure and external connecting surfaces for contacting, i.e. chips as well as circuit boards, for example. A preferred area of application of the method proposed here or area of use of the devices proposed here lies in flip-chip technology and also in the field of SMD (surface mounted device) technology.

BACKGROUND OF THE INVENTION

A method is known from JP 4-91 493 A in "Patent Abstracts of Japan", 1992, in which, for the thermal connection of connecting surfaces of two substrates, energy is applied to the rear of a transparent substrate through a transparent pressing plate, by means of which the connecting surfaces of the substrates are brought into abutment. A transparent glass plate is used as the pressing plate. In this method, in contrast to the method known from DE 44 46 289 A1, the application of laser energy is not applied to all contact pairs of the connecting surfaces simultaneously, but rather sequentially, a plurality of contact pairs being combined to form a unit in each case, to which laser energy is applied as a whole.

In the known method, the use of the transparent glass plate does allow for the transmission of a contact pressure onto the connecting surfaces of the substrates forming contact pairs with one another. However, as a result of manufacturing discrepancies, which can result for example in different heights of the contact metallization constructed on the connecting surfaces, it may occur that a part of the opposing connecting surfaces has no contact, so that there is an insufficient introduction of thermal energy into the respective contact pairs, which can lead to contact failures with the possible consequence of component failure during operation of the substrates which have been contacted with one another.

In U.S. Pat. No. 4,978,835, the connecting surfaces of two substrates are brought into abutment by a glass plate or flexible, transparent membrane, the contact pressure being applied by a different gas pressure between the upper and lower sides of the glass plate or membrane, for example by a vacuum. Subsequently, energy is applied to the contact surfaces by a laser beam radiating through the glass plate or membrane.

SUMMARY AND OBJECTS OF THE INVENTION

It is the object of the present invention to propose a method and a device, which allows for improved contacting of connecting surfaces of two substrates and therefore increased reliability during operation of substrates of this type.

In the method according to the invention, laser energy is applied separately to each of the contact pairs constructed between two connecting surfaces of the opposing substrates. In this manner, the possibility is created of adjusting the beam path, more particularly the focusing of the laser beam in such a manner that an optimal application of energy for the respective contact pair is effected. In this respect, a focusing device is axially displaced as a function of angular movements of a swivel mirror unit. In this manner, it is possible to effect changes in the beam path, more particularly a lengthening or shortening of the beam path, without causing a defocusing of the laser beam in respect of the respective contact pair to which laser energy is applied.

As a result of the focusing of the laser beam onto the respective contact pair, laser energy is also only applied to a correspondingly reduced proportion of the substrate material, so that undesirable temperature stressing of the substrate material is kept to a minimum. Accordingly, the residual absorption capacity which is also present in a transparent substrate material is lower than in cases where laser energy is applied to the entire surface of the substrate material.

It has proved particularly advantageous if the radiation energy emitted by a laser emitting device is deflected in a beam path via a first swivel mirror device onto a second swivel mirror device and by the second swivel mirror device onto a contact pair. As a result of the above double deflection of the beam path, it is possible to position the laser emitting device, and the substrate arrangement comprising the two substrates, relative to one another as desired. More particularly, it is possible, proceeding from a stationary arrangement of the laser emitting device and substrate arrangement, to apply laser energy to each contact pair of the connecting surfaces in succession in a controlled manner, without having to change the positioning of the laser emitting device or the substrate arrangement.

In addition to the above-mentioned improvement in the contact quality between associated connecting surfaces of the substrates attained by separate application of laser energy to the individual contact pairs, an aspect of the method of the invention allows for a further solution of the object forming the basis of the invention.

According to one aspect of the method according to the invention, the connecting surfaces of the substrates are pressed against one another by means of a pressing device acting upon the substrates, a transparent, non-compressible and deformable volume being arranged between a transparent force introduction device of the pressing device and a rear side of a substrate. In this respect, the above-mentioned volume acts, as a result of its deformability, as a pressure cushion, which allows for an application of pressure to the respective substrate simulating fluid pressure. In this manner, in contrast to pressure application, it is possible by means of a rigid plate to produce deformations in the substrate which counteract the formation of gaps between connecting surfaces of contact pairs and can thus compensate height differences of contact metallizations arranged on the connecting surfaces caused by manufacturing discrepancies. If a measurement of the infrared radiation emitted by the contact pair is effected, in order to control the focusing of the beam path onto the respective contact pair, then it is possible to monitor the focusing in a simple manner. It is also possible, in order to control the focusing of the beam path onto the respective contact pair, to carry out an optical monitoring of the contact pair by means of a camera device, to which end a decoupling of the visible light from the beam path is effected. By using the same beam path both for the application of energy to the contact pair and for monitoring the correct focusing of the laser beam onto the contact pair, it is possible to effect the monitoring with minimal additional outlay in apparatus. Furthermore, as a result of the above-mentioned double use of the beam path, no optical transmission errors are possible, which would allow for discrepancies between the actual focusing and the focusing which is detected.

In order to control the focusing of the laser beam onto the contact pair, a method has also proved advantageous in which the beam path of a relatively weak pilot laser, which is permanently emitted, is superimposed over the beam path of the laser emitting device, which is constructed as a power laser device preferably operated in pulse mode, in order to allow for a control of the focusing of the beam path of the power laser by means of a control of the focusing of the beam path of the pilot laser. The advantage of this method consists in that there can be no focusing errors as a result of phase displacements of the emitted laser beam on account of the corresponding wave lengths of pilot laser and power laser. A laser diode installed in or on the laser emitting device can be used as a pilot laser. An infrared camera is particularly advantageously used as a camera.

A further, particularly advantageous variant of the method consists in effecting a monitoring of the contact pair by means of the camera device and a measurement of the infrared radiation emitted by said contact pair in order to control the effective laser capacity in the contact pair. This type of control has proved particularly precise, since it takes into account a parameter having a decisive effect on the result of the capacity control by measuring the infrared emission, namely the focusing of the contact pair. In this manner, it is possible, for example, to prevent insufficient laser capacity caused solely by a defocusing from being compensated by an increase in the laser energy, although in principle a correction of the focusing without increasing the laser energy would be sufficient in order to obtain the required energy input into the contact pair.

The device according to the invention comprises a radiation transmitting device for generating a beam path, which is deflected at least twice, from the laser emitting device to the contact pair with a first and a second swivel mirror device, a focusing device, which is axially displaceable in the beam path, being arranged in the beam path between the laser emitting device and the contact pair.

This special design of the radiation transmitting device allows for a stationary positioning of the laser emitting device and the substrate arrangement formed by the substrates which are to be contacted with one another, which positioning can be maintained during the successive contacting of all contact pairs of the connecting surfaces of opposing substrates. Furthermore, the above-mentioned design of the radiation transmitting device according to the invention allows for a separate application of energy to all contact pairs, so that the respective optimal beam path for obtaining a corresponding optimal contacting result can be adjusted for each contact pair. In order to compensate changes in the beam path, more particularly a lengthening or shortening of the beam path, caused by a rotation of the swivel mirror device, which can result in a defocusing of the laser beam at the contact pairs, the axially displaceable focusing device, which comprises a convergent lens for example, is provided in the beam path.

According to another aspect of the invention, a pressing device is provided, which acts upon the substrates and comprises at least one transparent force introduction device, which is provided at least in the contact region with a rear side of a substrate with a transparent, non-compressible and deformable volume. In this manner, a type of pressure cushion is formed between the force introduction device and the rear side of the substrate, which pressure cushion, as already explained above, allows for a fluid-like application of pressure to the substrate with corresponding substrate deformation.

It has proved particularly advantageous if the force introduction device is covered with a layer of plastics material in order to form the transparent, non-compressible and deformable volume.

In order to increase the efficiency of the transparent, non-compressible and deformable volume in respect of a fluid-like application of pressure to the rear side of the substrate, the volume can be provided with a deformation limiting device acting transversely to the pressing direction.

If the focusing device is arranged in the beam path between the first swivel mirror device and the laser emitting device, then defocusing caused both by the first swivel mirror device and by the second swivel mirror device can be compensated by the focusing device.

It has proved particularly advantageous if a radiation decoupling device is arranged in the beam path between the laser emitting device and the focusing device for decoupling and deflecting the visible light from the beam path into a camera device. In this manner, a direct optical monitoring of the focusing of the laser beam onto the respective contact pair is possible.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 3 is a schematic view showing a further embodiment of the pressing device illustrated in FIGS. 1 and 2; and FIG. 4 is a schematic view showing a special application of the method.

DESCRIPTION OF THE PREFERRED EMBODIMENTS

Figure 1:
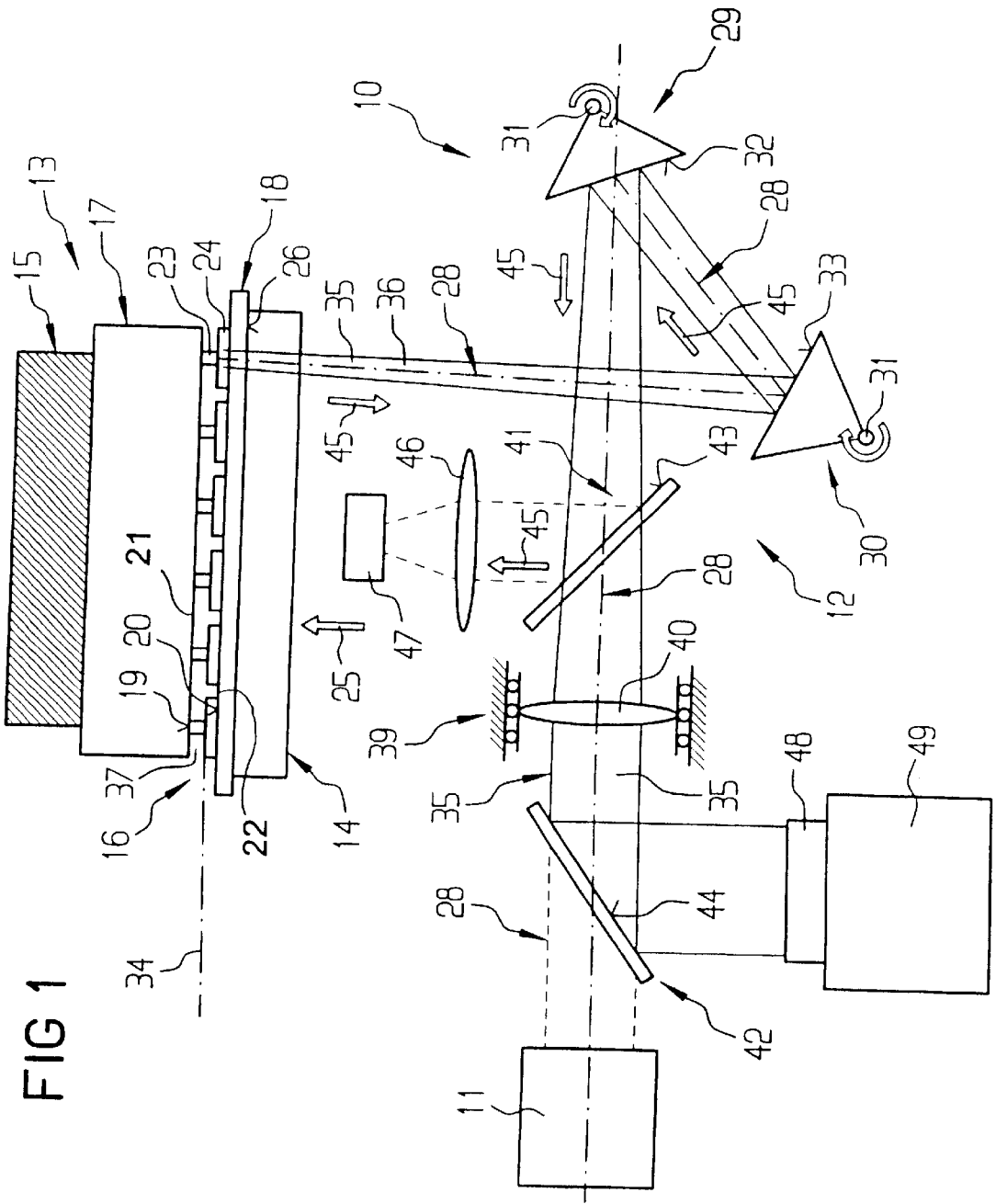
FIG. 1 is a schematic view showing an embodiment of a device for the thermal contacting of two substrates arranged in a pressing device.

Referring to the drawings in particular, FIG. 1 shows a laser connecting device 10 with a laser emitting device 11, a radiation transmitting device 12 and a substrate receiving device 13. In the present case, the substrate receiving device 13 comprises a pressing device 14 and a counterpressing device 15.

The substrate receiving device 13 is used for receiving a substrate arrangement 16 of two substrates 17, 18, which are provided with a conductor structure not illustrated in further detail here and external connections 19 and 20 respectively for contacting. In the present case, the substrate 17 is a chip; which is provided with a peripheral connecting surface arrangement 21 and whose connections 19 are to be contacted with the connections 20 of the substrate 18 also comprising a peripheral connecting surface arrangement 22. The substrate 18 in the illustrated embodiment is a support plate, whose connections 20 are to be connected with the connections 19. To this end, the connections 19 and 20 are provided with raised metal contact sections 23 and 24 respectively, which provide the connecting material required for a thermal connection.

In order to produce contact which is as free of clearance as possible for the subsequently thermally effected, intimate connection between the connecting surfaces 19 of the substrate 17 and the connecting surfaces 20 of the substrate 18, the pressing device 14 is displaceable in the direction of the arrow 25 towards a rear side 26 of the lower substrate 18, the required counterpressure being applied by the counterpressing device 15.

The counterpressing device 15 can be simultaneously constructed as a handling device, which is used for transferring the substrate 17 from a ready position, not shown in further detail here, into the contacting position illustrated in FIG. 1. The adhesion required to this end between the substrate 17 and the counterpressing device 15 constructed as a handling device can be generated, for example, via a vacuum applied between the counterpressing device 15 and the substrate 17.

The pressing device 14 and the substrate 18 arranged on the pressing device 14 have a composition which is transparent to the wavelength of a laser beam 27 emitted from the laser emitting device 11.

Arranged between the laser emitting device 11 and the substrate arrangement 16 in the substrate receiving device 13 is the radiation transmitting device 12 with two swivel mirror devices 29 and 30. As is clear from FIG. 1, the swivel mirror devices 29, 30 each comprise a mirror surface 32 or 33 pivotable about two spatial axes about a swivel axis 31 extending transversely to a beam path 28 and a swivel axis 38 extending parallel to the beam path. As a result of the double deflection of the beam path 28 effected by means of the two swivel mirror devices 29, 30, it is possible, starting from a beam path section 35 extending substantially parallel to a connecting plane 34 of the substrate arrangement 16, to produce a beam path section 36 extending substantially transversely to the connecting plane 34. In this respect, a pivoting movement of the second swivel mirror device 30 arranged after the first swivel mirror device 29 in the beam path 28, with a corresponding angle adjustment of the first swivel mirror device 29, allows for a successive separate laser energy irradiation of all of the contact pairs 39, each formed by two connections 19 and 20. In this respect, both the laser emitting device 11 and the substrate arrangement 16 arranged in the substrate receiving device 13 can maintain their positions.

As a result of the transparent construction of the pressing device 14 and substrate 18, the irradiation of each contact pair 37 is effected through the pressing device 14 and the substrate 18. On account of the radiation absorption behavior of the connecting surfaces 20, a heating and an at least partial melting of the metal contact sections 23, 24 occurs with a subsequent intimate connection between the connections 19 and 20.

From the illustration selected in FIG. 1, which shows an application of laser energy to a contact pair 37 arranged at the right-hand edge of the substrate arrangement 16 as an example of the successive irradiation of all contact pairs 37, it is clear that a focal length, which is adjusted in respect of the distance between the mirror surface 33 and the contact pair 37 and allows for precise focusing of the laser beam 27 onto the contact pair 37, needs to be adapted on account of the lengthened beam path section 36, for example, in the case of an energy irradiation of a contact pair 3 7 arranged at the left-hand edge of the substrate arrangement 16. To this end, a focusing device 39, which is axially displaceable in the beam path, is provided with a convergent lens 40 in the beam path section 35.

In the embodiment of the laser connecting device 10 illustrated in FIG. 1, two radiation decoupling devices 41 and 42 are inserted into the beam path 28, each of which are transparent to the laser beam 27 in the emission direction of the laser emitting device 11, but reflect radiation components emitted or reflected by the respective contact pair 37 according to the respectively selected angle of incidence of a respective mirror surface 43 or 44. As illustrated in FIG. 1, the radiation decoupling device 41 reflects, via the mirror surface 43, an infrared radiation component 45 emitted by the contact pair 37 as a result of the heating of 11 said contact pair into an infrared detector 47, following focusing by a convergent lens 46. The radiation decoupling device 42 reflects the portion of visible light existing in the radiation path 28 reflected by the contact pair 37 through the transparent substrate 18 and the transparent pressing device 14, via the mirror surface 44 into a objective lens 48 of a camera device 49 and thus, by means of the camera device 49, allows for monitoring of the contact pair 37.

In the combination with the focusing device 39 illustrated in FIG. 1, the camera device 49 is suitable, in particular in association with an image processing device, for defining an adjustment value acting upon the focusing device, not only for monitoring the exact focusing of the laser beam 27 onto the respective contact pair 37, but rather also for adjusting the focusing device. Based on an exact focusing of the laser beam 27 onto the contact pair 37, it is then possible to carry out a control of the effective laser capacity in the contact pair 37 by means of the infrared detector 47.

Figure 2:
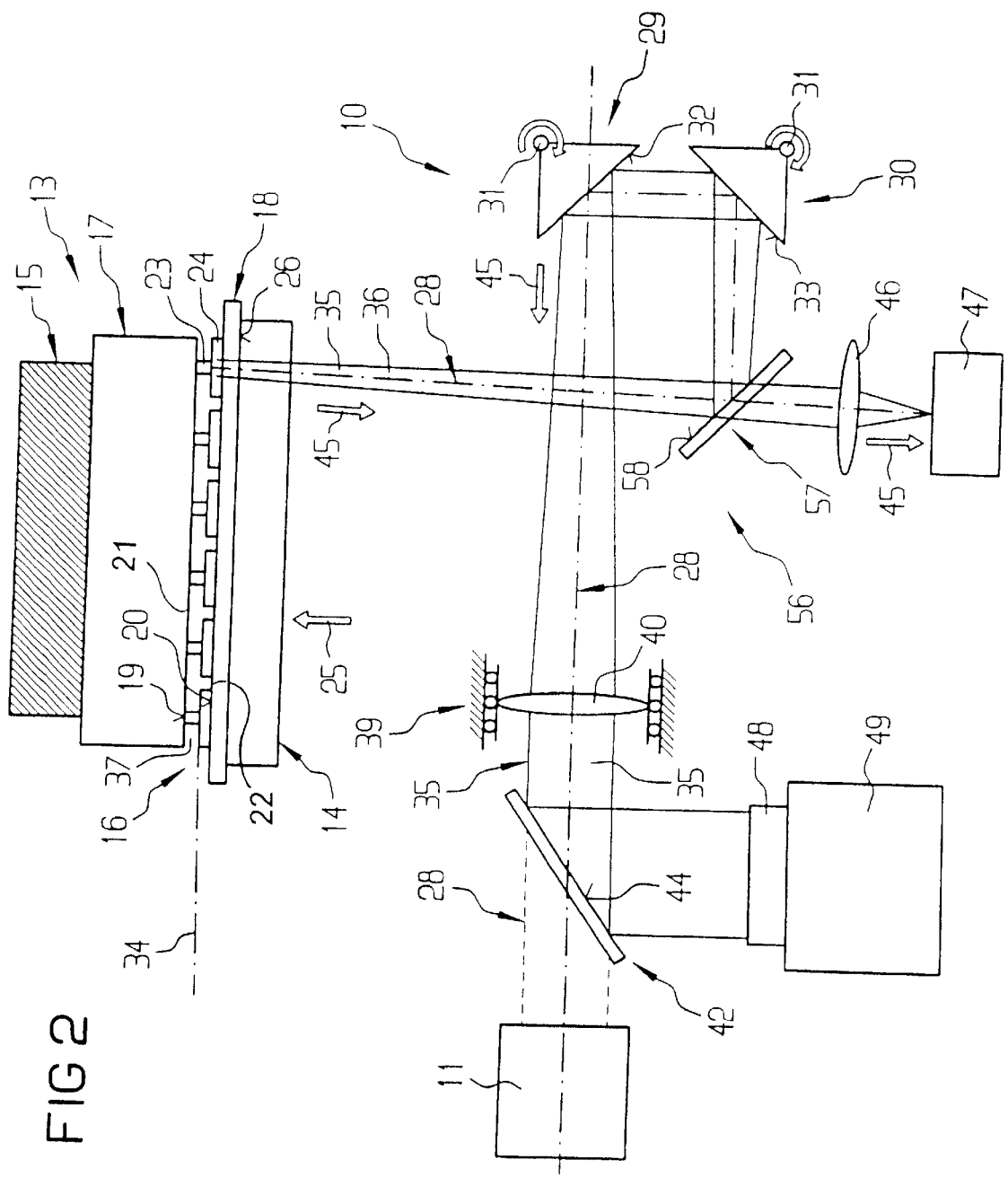
FIG. 2 is a schematic view showing a further embodiment of a device for the thermal contacting of two substrates arranged in a pressing device.

FIG. 2 shows the laser connecting device 10 with a radiation transmitting device 56, which as compared with the radiation transmitting device 12 in FIG. 1 has a modified construction with a different arrangement of the infrared detector 47. Otherwise, identical components are used in the laser connecting device 10 shown in FIG. 2 according to the identical reference numerals which are used. As is clear from a comparison of FIGS. I and 2, the swivel mirror devices 29 and 30 are disposed in a different relative arrangement in such a manner that the swivel mirror device 29 has maintained its position and the swivel mirror device 30 is now arranged beneath the swivel mirror device 29. Furthermore, instead of the radiation decoupling device 41, a radiation decoupling device 57 is provided, with a mirror surface 58 which is transparent to infrared radiation and highly reflective for the laser beam 27 of the laser emitting device 11. In this manner, it is possible, as shown in FIG. 2, to arrange the infrared detector 47 without radiation deflection directly on the optical axis of the infrared radiation reflected by the connection 20.

Overall, a more precise detection of the infrared radiation component 45 is possible using the arrangement illustrated in FIG. 2.

FIG. 3 shows a pressing device 50 which is modified as compared with the pressing device 14 illustrated in FIGS. 1 and 2 and has a transparent and rigidly constructed force introduction device 51, which can be made, for example, of glass or a transparent epoxy resin. Disposed between the force introduction device 51 and the rear side 26 of the substrate 18 is a transparent, non-compressible and furthermore deformable volume, which in the present case is constructed as a silicon cushion 52. In the illustrated embodiment, the silicon cushion 52 is accommodated by a receiving element 53 of the force introduction device 51, the receiving element 53 being formed by a circumferential peripheral web 54 of the force introduction device 51.

When pressure is applied to the substrate arrangement 16 by the force introduction device 51 as indicated by the force arrow 55, the noncompressible and deformable volume formed by the silicon cushion 52 displays behavior under pressure similar to fluid, so that deviations in the heights h and $h_i$ of the contact metallizations 23 of the substrate 17 are compensated by a corresponding deformation of the substrate 18. In this respect, the peripheral web 54 acts as a deformation limit acting transversely to the pressing direction.

As FIG. 3 shows, the use of the pressure cushion 52 prevents a formation of gaps between the contact metallizations 23 and 24 of the substrates 17 and 18 arranged opposite one another, in spite of deviations in the heights h and $h_i$ of the metal contact sections 23. From the above, it is clear that—the arrangement of a transparent, non-compressible and deformable volume in a pressing device when effecting a contacting of opposing connections of two substrates also effectively improves the quality of the contacting irrespective of the type of application of laser energy to the connecting surfaces, i.e. both in the case of separate and joint application of laser energy to the connecting surfaces, since a gap formation between the connections is counteracted in each case.

The method variants described with the aid of the above embodiments, as well as the devices used in said methods, can be advantageously used, amongst other things, in the manufacture of chip cards as well as the manufacture of housed chip modules, more particularly manufactured according to "chip scale packaging" technology. Irrespective of the respective method variant or the respective embodiment of the device, it is also possible to produce connections between a substrate, more particularly constructed as a chip 59, and a support substrate 60, as illustrated in FIG. 4.

In contrast to the connections illustrated in FIGS. 1 to 3, in the thermal connection between the chip 59 and the support substrate 60 using the devices illustrated in FIG. 1, 2 or 3, an adhesive film 61 is arranged between the chip 59 and the support substrate 60, which increases the stability of the bond of chip 59 and support substrate 60. The adhesive film 61 illustrated in FIG. 4 can already be arranged prior to the manufacture of the connection on one of the two substrates 59 or 60, or as a separate component between the substrates 59 and 60, as illustrated. Depending on whether the adhesive film 61 is an electrically nonconductive or conductive material, it is possible prior to manufacturing the thermal connection by means of the laser connecting device to produce a direct contact between the connections 62 of the chip 59 and the connections 63 of the support substrate 60 by way of the pressing device 14 and counterpressing device 15, with a displacement of the interposed adhesive film 61, or to produce indirect contact, via the adhesive film 61, between the connections 62 of the chip 59 and the connections 63 of the support substrate 60.

Depending on the construction of the electrically conductive connection between the terminals 62, 63, the laser connecting device can be used for soldering, for producing an adhesive fixing prior to hardening of an adhesive compound or, supported by the pressing device, also for producing a thermal compression connection. In addition to the production of the thermal connection between the respective contact partners, the laser connecting device can be used for hardening the adhesive.

While specific embodiments of the invention have been shown and described in detail to illustrate the application of the principles of the invention, it will be understood that the invention may be embodied otherwise without departing from such principles.

What is claimed is:

1. A method for the thermal connection of overlapping connecting surfaces of two opposing substrates with contact pairs between the connecting surfaces of the opposing substrates, the method comprising the steps of:

providing one of the two substrates as a transparent substrate, the transparent substrate being transparent to laser energy;

applying laser energy from a laser emitting device to the connecting surfaces from a rear side of the transparent substrate by angular movements of a swivel mirror device applying laser energy from the laser emitting device separately to each of the contact pairs by angular movements of the swivel mirror device;

axially displacing a focusing device in a beam path between the laser emitting device and the contact pairs as a function of the angular movements of the swivel mirror device; and pressing connecting surfaces of the substrates against one another with a pressing device acting upon one of the substrates, the pressing device including a transparent force introduction device and a transparent non compressible deformable volume forming a pressure cushion simulating fluid pressure, the deformable volume being arranged between the transparent force introduction device and a rear side of one of the substrates.

2. A method according to claim 1, wherein said step of applying laser energy from the laser emitting device separately to each of the contact pairs by angular movements of the swivel mirror device includes deflecting a laser beam emitted by the laser emitting device via the swivel mirror device onto another swivel mirror device and deflecting the laser beam deflected by the swivel mirror device with the another swivel mirror device onto a respective one of the contact pairs.

3. A method according to claim 1, further comprising measuring infrared radiation emitted by the contact pair for controlling the application of the laser energy of a laser beam emitted by the laser emitting device onto a respective one of the contact pairs.

4. A method according to claim 1, wherein the respective one of the contact pairs to which laser energy is applied reflect visible light along the beam path and further comprising decoupling the visible light from the beam path and effecting an optical monitoring of the contact pair using a camera device for controlling the application of the laser beam onto a respective one of the contact pairs.

5. A method according to claim 1, wherein a measurement of the infrared radiation emitted by the contact pair is effected in order to control the application of the laser energy of a laser beam emitted by the laser emitting device onto a respective one of the contact pairs and an optical monitoring of the contact pair is effected by means of a camera device in order to control the position of the laser beam with respect to one of the contact pairs.

6. A device for manufacturing a thermal connection of overlapping connecting surfaces of two substrates, one substrate being a transparent substrate, and laser energy being applied to the connecting surfaces from a rear side of the transparent substrate, the device comprising:

a laser emitting device for emitting radiation energy in the form of a laser beam;

a radiation transmitting device for transmitting the radiation energy from the laser emitting device to a contact pair of the connecting surfaces, the radiation transmitting device comprising a first swivel mirror device and a second swivel mirror device for generating a beam path from the laser emitting device to the contact pair, the beam path being deflected by the first swivel mirror device and the beam path being deflected by the second swivel mirror device and a focusing device, which is axially displaceable in the beam path, is arranged in a beam path between said laser emitting device and the contact pair; and a pressing device acting upon the transparent substrate with at least one transparent force introduction device, the transparent force introduction device being provided with a transparent non compressible deformable volume, providing a pressure cushion for the application of pressure, simulating fluid pressure, in a contact region of a rear side of the one of the substrates.

7. A device according to claim 6, wherein the force introduction device is covered with a layer of plastics material to form said deformable volume.

8. A device according to claim 6, further comprising a deformation limiting device extending transversely to the pressing device, said deformation limiting device limiting the deformation of said deformable volume.

9. A device according to claim 6, wherein the focusing device is arranged in the beam path between the first swivel mirror device and the laser emitting device.

10. A device according to claim 9, wherein the contact pair reflects visible light along the beam path and wherein a radiation decoupling device is arranged in the beam path between the laser emitting device and the focusing device for decoupling and deflecting the visible light from the beam path into a camera device.

* * * * *